United States Patent
Sung et al.

(10) Patent No.: US 10,510,610 B2
(45) Date of Patent: Dec. 17, 2019

(54) STRUCTURE AND METHOD OF FORMING FIN DEVICE HAVING IMPROVED FIN LINER

(71) Applicant: Varian Semiconductor Equipment Associates, Inc., Gloucester, MA (US)

(72) Inventors: Min Gyu Sung, Essex, MA (US); Naushad K. Variam, Marblehead, MA (US); Sony Varghese, Manchester, MA (US); Johannes Van Meer, Middleton, MA (US); Jae Young Lee, Bedford, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/938,255

(22) Filed: Mar. 28, 2018

(65) Prior Publication Data
US 2019/0304841 A1    Oct. 3, 2019

(51) Int. Cl.
*H01L 21/8234* (2006.01)
*H01L 21/265* (2006.01)
*H01L 21/02* (2006.01)
*H01L 21/266* (2006.01)
*H01L 27/088* (2006.01)
*H01L 29/06* (2006.01)
*H01L 21/762* (2006.01)

(52) U.S. Cl.
CPC .. *H01L 21/823431* (2013.01); *H01L 21/0217* (2013.01); *H01L 21/02164* (2013.01); *H01L 21/266* (2013.01); *H01L 21/26513* (2013.01); *H01L 21/26586* (2013.01); *H01L 21/76224* (2013.01); *H01L 21/823481* (2013.01); *H01L 27/0886* (2013.01); *H01L 29/0649* (2013.01)

(58) Field of Classification Search
CPC ..... H01L 21/823431; H01L 21/823481; H01L 21/76224; H01L 21/26513; H01L 21/26586; H01L 21/266; H01L 21/0217; H01L 21/02164; H01L 27/0886; H01L 29/0649
USPC ............... 438/437, 283, 275, 164, 151, 149; 257/401, 255, 623, E21.057, E21.059, 257/E21.345, E21.412, E21.633, E27.112, 257/E27.062, E27.103, E29.275, E29.286
See application file for complete search history.

(56) References Cited

U.S. PATENT DOCUMENTS

| | | | |
|---|---|---|---|
| 2005/0227435 A1* | 10/2005 | Oh .................. | B82Y 10/00 438/257 |
| 2013/0320460 A1* | 12/2013 | Baek ................ | H01L 21/76237 257/401 |
| 2016/0322494 A1* | 11/2016 | Li .................... | H01L 29/7848 |
| 2018/0130800 A1* | 5/2018 | Huang ............... | H01L 27/0886 |

* cited by examiner

*Primary Examiner* — Dao H Nguyen

(57) ABSTRACT

A method for forming a semiconductor device. The method may include providing a transistor structure, where the transistor structure includes a fin array, the fin array including a plurality of semiconductor fins, disposed on a substrate. A liner may be disposed on the plurality of semiconductor fins. The method may include directing first angled ions to the fin array, wherein the liner is removed in an upper portion of the plurality of semiconductor fins, and wherein the liner remains in a lower portion of the at least one of the plurality of semiconductor fins, and wherein the upper portion comprises an active fin region to form a transistor device.

16 Claims, 5 Drawing Sheets

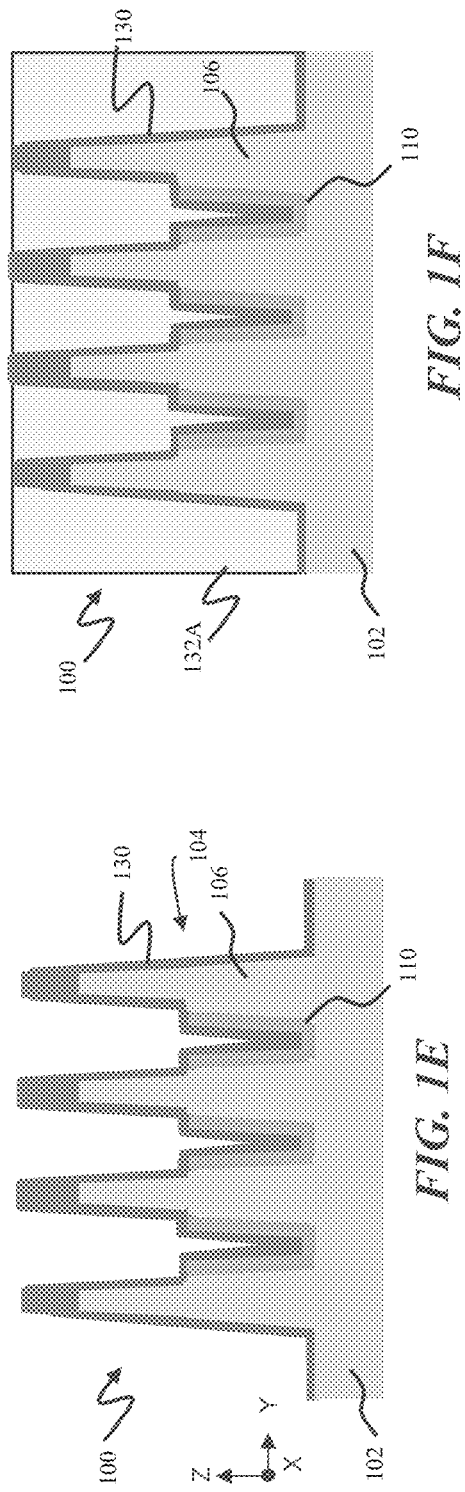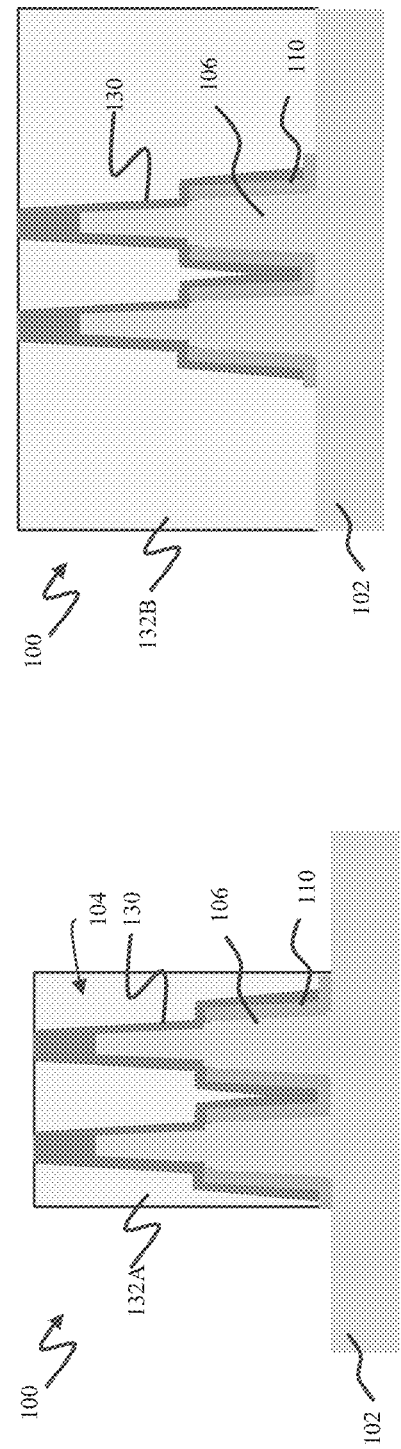

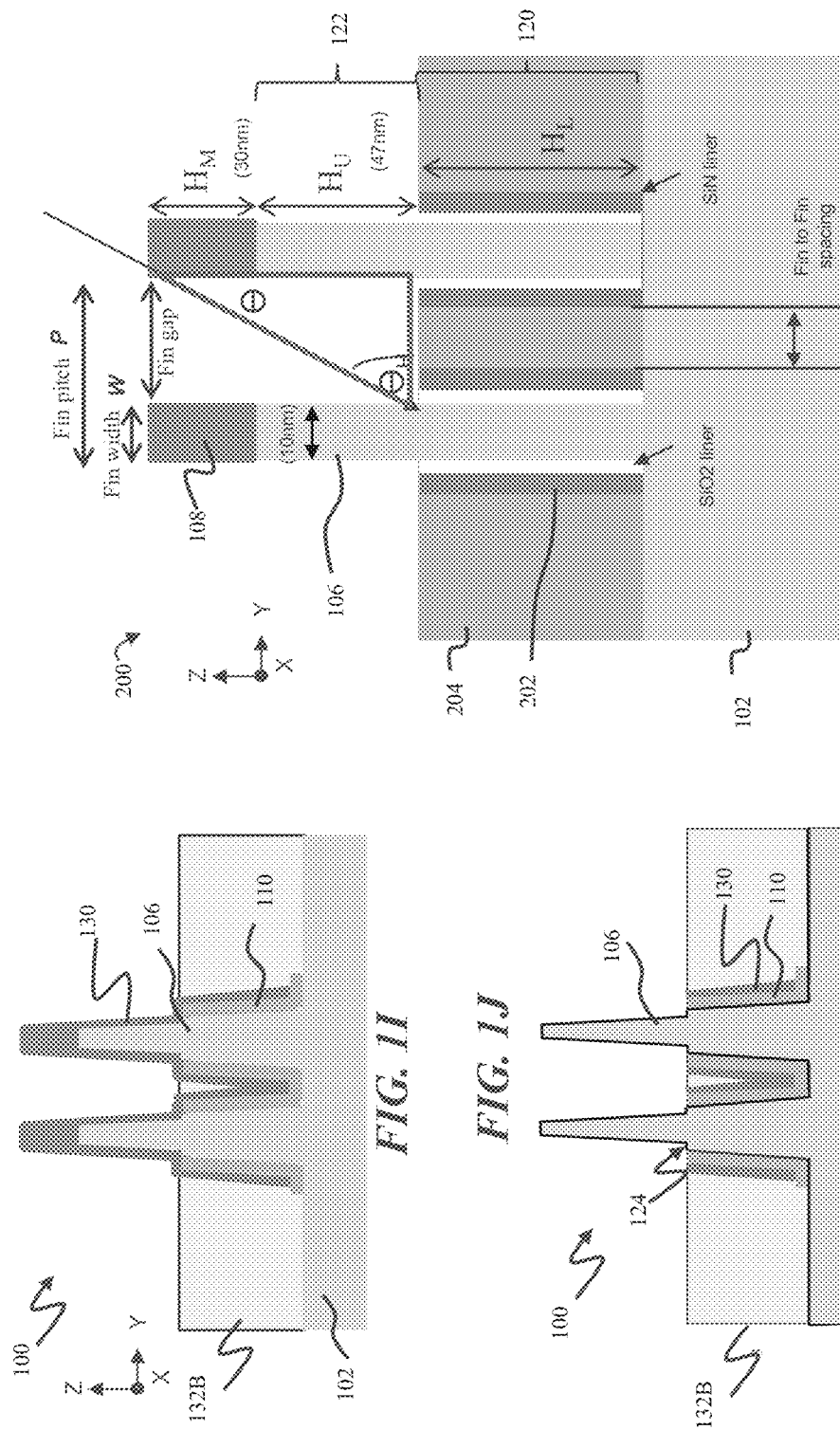

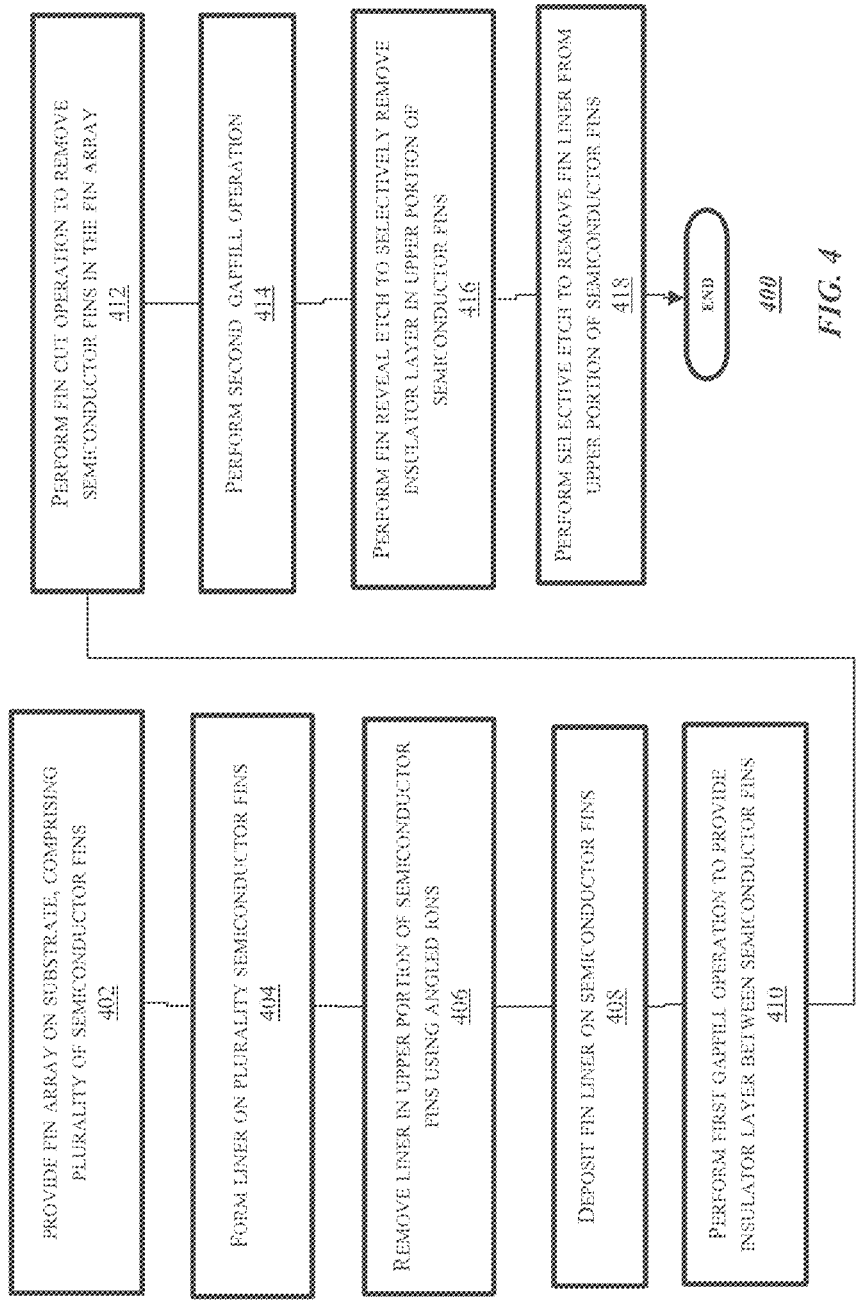

STRUCTURE AND METHOD OF FORMING FIN DEVICE HAVING IMPROVED FIN LINER

FIELD

The present embodiments relate to semiconductor device structures, and more particularly, to structures and processing for transistor devices.

BACKGROUND

As semiconductor devices scale to smaller dimensions, the ability to avoid defects in device structures becomes more challenging. For example, the synthesis of three-dimensional semiconductor transistors, such as fin type field effect transistors (finFET), involves many deposition and etch operations to define a gate structure and source/drain (S/D) region of a transistor. One useful feature is to generate a smaller active fin width (CD), for the purposes of improving device performance. In some applications, a target fin width of 5 nm may not be readily achievable, since the fins may not be structurally stable at such narrow dimensions, especially for high aspect ratios, such as 10/1, 20/1, and so forth. Accordingly, commercial device applications may employ wider fins, such as 10 nm, where problems such as inadequate sub-fin leakage control may be evident for narrower fins. Another approach to reduce sub-fin leakage current on devices, such as N-type FETs (NFETS) is to increase the oxide thickness along the sidewalls of fins. Thicker oxide may reduce spacing between adjacent fins, leading to gap fill problems for oxide formed between fins, including void formation and active fin height variation. The use of thinner oxide layers along fins allows better oxide gapfill, and better active fin height control, while leading to higher sub-fin leakage current, particularly for NFET devices. Moreover, known finFET device processing schemes may lead to additional recess of gap fill oxide when the oxide liners are removed, leading to active fin height variation.

With respect to these and other considerations, the present disclosure is provided.

BRIEF SUMMARY

In one embodiment, a method for forming a semiconductor device is provided. The method may include providing a transistor structure, where the transistor structure includes a fin array, the fin array including a plurality of semiconductor fins, disposed on a substrate. A liner may be disposed on the plurality of semiconductor fins. The method may include directing first angled ions to the fin array, wherein the liner is removed in an upper portion of the plurality of semiconductor fins, and wherein the liner remains in a lower portion of the at least one of the plurality of semiconductor fins, and wherein the upper portion comprises an active fin region to form a transistor device.

In another embodiment, a semiconductor device may include a semiconductor fin, disposed on a substrate. The semiconductor fin may include a lower portion, the lower portion having a first width, and an upper portion, the upper portion having a second width, wherein the semiconductor fin defines a fin recess between the lower portion and the upper portion. The semiconductor device may further include a liner, disposed on the lower portion of the semiconductor fin, the liner comprising an insulator, wherein the liner is not disposed on the upper portion. The semiconductor device may also include an isolation layer disposed on the substrate adjacent the semiconductor fin, up to a level of the fin recess.

In a further embodiment, a method of forming a finFET device may include providing a transistor structure, the transistor structure comprising a fin array formed from a plurality of semiconductor fins, disposed on a substrate, wherein a liner is disposed on the plurality of semiconductor fins. The liner may include an oxide layer, disposed adjacent the semiconductor fins; and a nitride layer, disposed on the oxide layer. The method may also include directing first angled ions to sidewalls of the semiconductor fins, wherein the liner is removed in an upper portion of the plurality of semiconductor fins. The method may include, after the directing the first angled ions, directing second angled ions to the sidewalls of the semiconductor fins. As such, a width of the plurality of semiconductor fins in the upper portion may be reduced from a first width, before the directing the second angled ions, to a second width after the directing the second angled ions, where the liner remains in a lower portion of the plurality of semiconductor fins.

BRIEF DESCRIPTION OF THE DRAWINGS

FIG. 1A to FIG. 1J show a device structure at various instances of fabrication, according to embodiments of the disclosure;

FIG. 2, shows a schematic depiction of exemplary geometry of a device structure;

FIG. 4 shows an exemplary process flow, according to further embodiments of the disclosure.

DETAILED DESCRIPTION

Figure 1A:
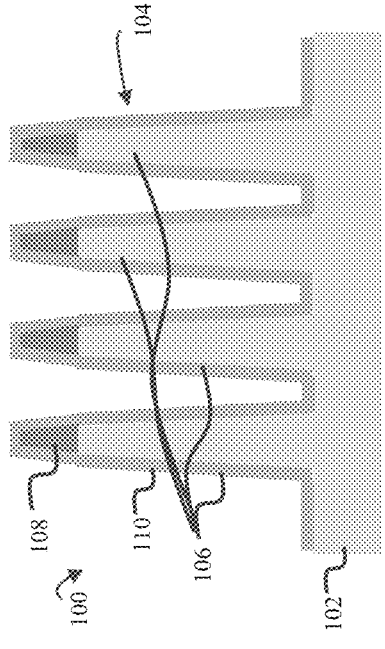

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Turning now to FIG. 1A FIG. 1J there is shown a device structure 100, at various instances of fabrication, according to embodiments of the disclosure. The device structure 100 is shown in side cross-sectional view through the Y-Z plane of the Cartesian coordinate system shown. At FIG. 1A, a fin array 104 is disposed on a substrate base 102. The fin array 104 may be monocrystalline semiconductor material, such as silicon, silicon:germanium alloy, or other semiconductor material. The fin array 104 may be formed integrally and monolithically with the substrate base 102, as known in the art. The substrate base 102 may be part of a bulk semiconductor substrate, or may be, for example a layer in a silicon-on-insulator substrate. The fin array 104 includes a plurality of semiconductor fins, shown as semiconductor fins 106, where the semiconductor fins 106 extend along the X-axis, as will be readily appreciated by those of skill in the art. In various non-limiting embodiments, the width W of semiconductor fins 106 may be less than 30 nm, and may be 15 nm, 10 nm, or less in some instances. In some embodiments, the height H of the semiconductor fins may be in the range of 75 nm to 150 nm. In different embodiments, the pitch P, or repeat distance, meaning the same edge-to-same edge or center-to-center distance between adjacent semiconductor fins, may be 42 nm, 32 nm, or 25 nm. The embodiments are not limited in this context. At the instance shown in FIG. 1A, the device structure 100 includes a mask layer 108, where the mask layer 108 may be a hardmask material, including silicon nitride, carbon, or other material.

Figure 1B:
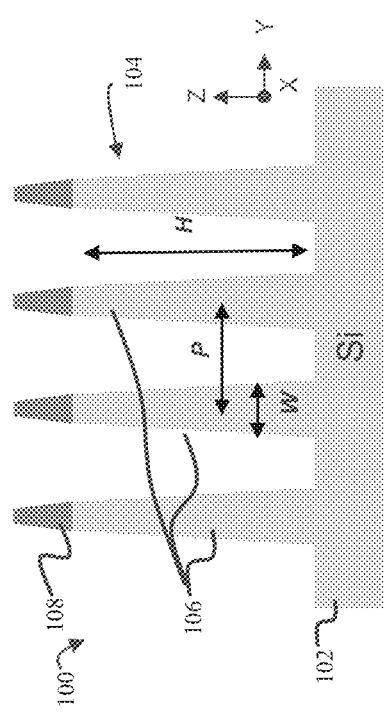

Turning to FIG. 1B, there is shown a subsequent instance, where a liner 110 is deposited over the fin array 104. The liner 110 may be deposited in a blanket deposition process, as known in the art, including chemical vapor deposition, or similar process. The liner 110 may coat sidewalls of the semiconductor fins 106, as shown. In some embodiments, the liner 110 may be one layer, such as silicon oxide. In other embodiments, the liner 110 may be a bilayer, such as a silicon oxide/silicon nitride bilayer, where the silicon oxide layer is immediately adjacent a semiconductor fin 106. According to various embodiments, the thickness of the liner 110 may be selected to provide more robust resistance to sub-fin leakage. For example, the liner may include an especially thick layer of silicon oxide, as compared to known finFET technology. As an example, the thickness of a silicon oxide layer of the liner 110 may be on the order of 3 nm.

Figure 1C:
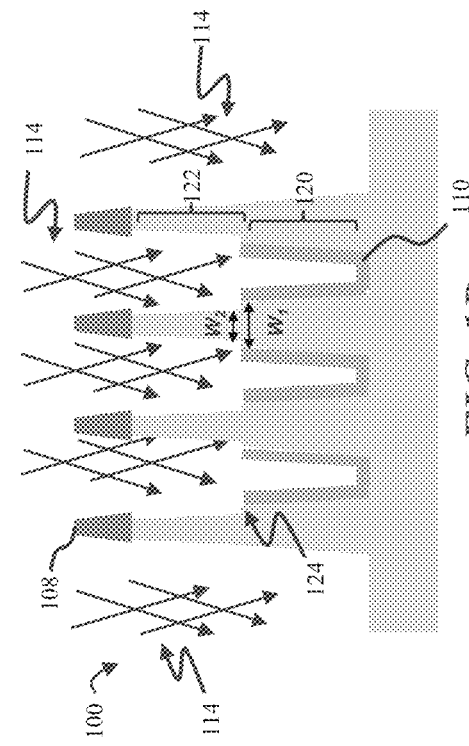

Turning now to FIG. 1C, there is shown an instance, subsequent to the instance of FIG. 1B, where a portion of the liner 110 is selectively removed. Notably, FIG. 1C depicts an example of directing first angled ions 112 to sidewalls of the semiconductor fins 106. As shown, the first angled ions 112 are directed in a manner wherein the liner 110 is removed from an upper portion 122 of the semiconductor fins 106, while the oxide liner remains in a lower portion 120 of the semiconductor fins 106, the so-called sub-fin region. As such, the upper portion 122 may be designed as an active fin region to form a transistor device, with the sub-fin region covered by the liner 110, as detailed below. Notably, the first angled ions 112 may be shadowed by the semiconductor fins in a manner to prevent the first angled ions 112 from striking the lower portion 120, at least for interior semiconductor fins of a semiconductor array. Notably, certain of the semiconductor fins 106, disposed on the outside of the fin array 104, present sidewalls not shadowed from the first angled ions 112. Accordingly, the liner 110 may also be removed from the lower portion of outside sidewalls of these semiconductor fins. In subsequent operations, such semiconductor fins may not form active fins, and may be removed.

In various embodiments, the angled ions 112 may be provided in a reactive ion etching mixture, wherein the angled ions 112 selectively etch the liner 110 with respect to the semiconductor fins 106. Such reactive ion etching mixture may employ any suitable combination of gas phase species as known in the art for etching the particular material of liner 110. In examples where the liner 110 is formed of one layer of silicon oxide, the reactive ion etching mixture may be selected to etch silicon oxide selectively with respect to silicon, the material of semiconductor fins 106. In examples where the liner 110 is a silicon oxide/silicon nitride bilayer the angled ions 112 may be provided in a series of operations, where the first operation provides a reactive ion etching mixture suitable for etching silicon nitride, while a second operation provides a reactive ion etching mixture suitable for etching silicon oxide.

As shown in FIG. 1C, upon completion of etching of the liner 110 from upper portion 122, the semiconductor fins 106 are spaced wider apart from one another in the upper portion 122, as compared to the lower portion 120, where the liner 110 remains.

Figure 1D:
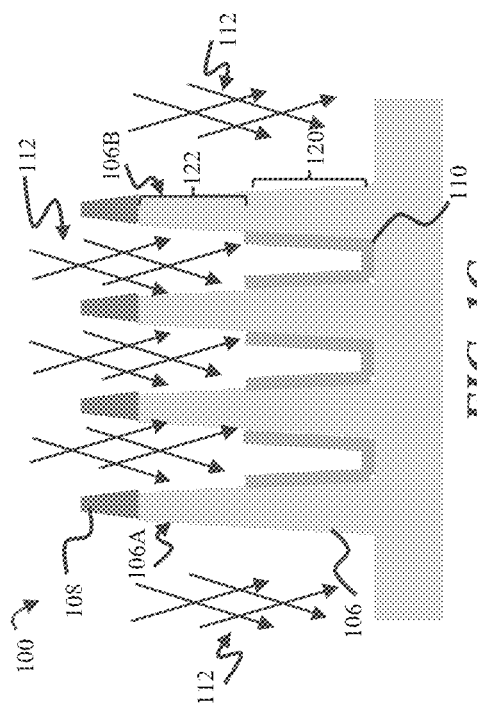

Turning now to FIG. 1D, there is shown a subsequent instance to the instance of FIG. 1C. In FIG. 1D, an optional operation is shown for trimming upper portions 122 of the semiconductor fins 106. As shown, the operation involves directing second angled ions 114 to the sidewalls of the semiconductor fins 106. In this example, the second angled ions 114 are provided to etch the semiconductor fins 106. Accordingly, the upper portion 122 is reduced from a first width $W_1$, before the directing the second angled ions 114, to a second width $W_2$ after the directing the second angled ions 114. The second angled ions 114 may also be directed in a reactive ion etching mixture, designed to selectively etch the semiconductor fins 106 with respect to the liner 110 and the mask layer 108. In one example, a semiconductor fin 106 having a first width of 10 nm may be reduced in width to 5 nm in the upper portion 122. In some examples, the first width may be between 8 nm to 15 nm, while the second width is between 4 nm to 8 nm. The embodiments are not limited in this context.

As such, the liner 110 may remain substantially as shown before exposure to the second angled ions 114. In this operation, the lower portion 120 of semiconductor fins 106 may accordingly remain unaltered, retaining the previous shape and size. In some embodiments, the angle of second angled ions 114 may be designed so the second angled ions 114 do not strike the liner 110, while etching the semiconductor fins 106. As such, a recess 124 may be generated at the region where the upper portion 122 and lower portion 120 meet.

Turning also to FIG. 2, there is shown a schematic depiction of a device structure 200, illustrating the geometry for selectively removing a liner or etching the semiconductor material in upper portions of semiconductor fins using angled ions, in accordance with embodiments of the disclosure. In the device structure 200, processing using angled ions (not shown) has proceeded to a point where a liner 202 has been removed from sidewalls of semiconductor fins 106 in the upper portion 122. The liner 202 remains in the lower portion 120, and an isolation layer 204 is formed between the semiconductor fins 106, up to the top of the liner 202, leaving the semiconductor fins 106 exposed in the upper portion 122. Thus, the upper portion 122 may form an active device region for a transistor to be formed in the semiconductor fins 106. In the example of FIG. 2, a mask layer 108 is present on the top of semiconductor fins 106. The mask layer 108 may be present during a reactive angled ion etching operation. Thus, a height of structures formed by the mask layer 108 and upper portion 122 is equal to $H_U + H_M$, where $H_U$ is the height of upper portion 122 and $H_M$ is the thickness of mask layer 108. The fin gap formed between adjacent semiconductor fins is simply equal to the fin pitch P–fin width W, as shown. As shown, in order for angled ions to penetrate to the level of the bottom of upper portion 122, the angle of angled ions, $\theta_H$, where $\theta_H$ represents an angle of incidence with respect to a substrate plane, (meaning the X-Y plane in this example), is set according to specific criteria. Said differently, the angle of angled ions defines the depth of penetration of the ion based upon the fin pitch and fin width. Particularly, tan $\theta_H=(H_U+H_M)/$(fin pitch−fin width). As noted above, the fin pitch P−fin width W is simply the fin gap. Table I provides some examples of $\theta_H$ for different technology nodes, where an active fin height, meaning the value of $H_U$, is 47 nm, and mask thickness $H_M$ is 30 nm. These examples are merely exemplary, meant to illustrate the general principle for determining the angle for angled ions to generate a targeted height of a fin portion where etching is to take place, and thus to define the upper portion where an active fin is to be formed. In various embodiments, the height of the upper portion, or active fin height, ranges from 40 nm to 80 nm. As shown in table I. the angle of angled ions may range between approximately 67 degrees and 79 degrees for advanced finFET technology nodes.

TABLE I

Angle of incidence for angled ions for different finFET technologies
tan θ = 77 nm/(fin pitch − fin width)

10 nm node (fin pitch = 42 nm): $\theta_H$ = 67.4°
7 nm node (fin pitch = 32 nm): $\theta_H$ = 74°
5 nm node (fin pitch = 25 nm): $\theta_H$ = 78.9°

Notably, the example of Table I is based upon the geometry not including a liner 110, as in FIG. 1D. Inclusion of liner to account for the thickness of the liner will result in narrower gaps, shown as the fin-to-fin spacing in FIG. 2. To direct ions between adjacent fins including a liner entails a steeper angle of incidence for a given technology node. Thus, instead of fin gap, the fin-to-fin spacing may be used to determine the tangent of the angle of incidence to be used for removal of the liner 110 or liner 202, as generally depicted in FIG. 1C. The exact value of fin-to-fin spacing S may be calculated according to: S=fin pitch P−(fin width W+2×(liner thickness)). Assuming the fin width is 10 nm and the liner is composed of a $SiO_2$ layer and SiN layer, the above equation transforms to S=fin pitch P−(10 nm+2× ($SiO_2$ thickness+SiN thickness)).

Table II provides examples of fin-to-fin spacing for different finFET technologies, assuming a 10-nm fin width, and a 3-nm silicon nitride liner thickness. As shown, the fin-to-fin spacing may be 25 nm or less for 10 nm technology nodes or more advanced.

TABLE II

Fin-to-fin Spacing for different finFET technologies

|  | SiO2 liner thickness (nm) | Fin to Fin space (nm) |
| --- | --- | --- |
| 10 nm node | 1 | 24 |
| 42 nm fin pitch | 1.5 | 23 |
|  | 2 | 22 |
| 7 nm node | 1 | 14 |
| 32 nm fin pitch | 1.5 | 13 |
|  | 2 | 12 |
| 5 nm node | 1 | 7 |
| 25 nm fin pitch | 1.5 | 6 |
|  | 2 | 5 |

While FIG. 1D illustrates an operation where an upper portion 122 of the semiconductor fins 106 is thinned, in other embodiments, the thinning may be omitted. Turning now to FIG. 1E there is shown a subsequent instance where depositing of a fin liner 130 is performed. The fin liner 130 may be deposited by known methods, where the fin liner 130 covers the lower portion 120 and the upper portion 122 of the semiconductor fins 106. Notably, in the region of the upper portion 122, the semiconductor fins 106 do not present the liner 110, and accordingly are spaced apart from one another to a greater extent than in the lower portions 120. In the embodiments where the upper portion 122 has additionally been thinned according to the operation of FIG. 1D, the semiconductor fins 106 are even further spaced apart from one another in the upper portion 122. This geometry advantageously favors filling of recesses between the semiconductor fins 106 in gapfill operations, while not tending to cause pinch-off and form buried inclusions, as may happen when upper portions 122 are spaced too close to one another. Notably, the lower portions 120 where the semiconductor fins 106 are more closely spaced from one another just presents a depth of 40 nm to 80 nm in some examples, so pinch off may be avoided while the deposition of the fin liner 130 takes place.

Turning to FIG. 1F there is shown a subsequent instance after an insulating layer 132A is formed to isolate semiconductor fins 106 from one another. The insulator layer 132A may be a known material such as an oxide, including a flowable oxide.

Turning to FIG. 1G there is shown a subsequent instance after a fin cut operation is performed, where two outer semiconductor fins of the fin array 104 are removed. The fin cut operation may be performed according to known methods. At this stage, the remaining semiconductor fins pictured, the semiconductor fins 106, may be used as active fins, meaning in active devices, such as transistors. At FIG. 1H, insulator is provided in portions of the device structure 100 where the outer semiconductor fins were removed, where the insulator layer is now shown as insulator layer 132B. The newly added material of insulator layer 132B may be the same as the material of the insulator layer 132A. Turning to FIG. 1I there is shown a subsequent instance after a recess etch is performed to recess the insulator layer 132B and to reveal the active fin area of the semiconductor fins 106. The recess etch may be performed using a known etchant for selectively etching the insulator layer 132B with respect to the fin liner 130. For example, the insulator layer 132B may be silicon oxide, while the fin liner 130 is silicon nitride, so the etchant used for etching insulator layer 132B may etch silicon oxide selectively with respect to silicon nitride. As suggested in FIG. 1I, the etching may cause the insulator layer 132B to recess to the level where the insulator layer 132B is coplanar with the top of the fin liner 130. Turning to FIG. 1J, there is shown a subsequent instance after selective removal of the fin liner 130, so the active portion of the semiconductor fins 106 is exposed. In cases where the fin liner 130 is silicon nitride, the fin liner 130 may be removed using hot phosphoric acid, for example.

Figure 3A:
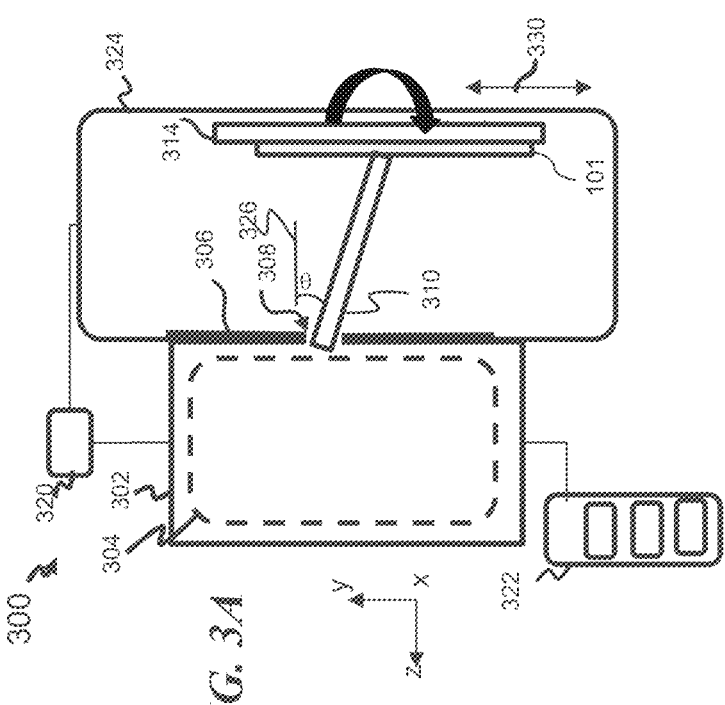
FIG. 3A shows a processing apparatus, depicted in schematic form, in accordance with embodiments of the disclosure.

In various embodiments of the disclosure, the angled ions used in the various operations outlined above may be provided as an ion beam, such as from a compact plasma-based apparatus. Turning now to FIG. 3A, there is shown a processing apparatus 300, depicted in schematic form. The processing apparatus 300 represents a processing apparatus for performing angled ion treatment of a substrate, such as for reactive angled ion beam etching of a substrate. Different than many common reactive ion etching (RIE) the reactive angled ion beam etching may direct ions in a reactive ion etching environment at a controlled, non-zero angle of incidence with respect to a perpendicular to a substrate plane. This geometry facilitates directing ions to select portions of substrate structures, for instance. The processing apparatus 300 may be a plasma based processing system having a plasma chamber 302 for generating a plasma 304 therein by any convenient method as known in the art. An extraction plate 306 may be provided as shown, having an extraction aperture 308, where an angled ion beam 310 may be extracted to directing angled ions to a substrate 101. The substrate 101, including, for example, the aforementioned substrate base 102 and fin array 104, is disposed in the process chamber 324. A substrate plane of the substrate 101 is represented by the X-Y plane of the Cartesian coordinate system shown, while a perpendicular to the plane of substrate lies along the Z-axis (Z-direction).

As further shown in FIG. 3A, the angled ion beam 310 may be extracted when a voltage difference is applied using bias supply 320 between the plasma chamber 302 and substrate 101, or substrate platen 314, as in known systems. The bias supply 320 may be coupled to the process chamber 324, for example, where the process chamber 324 and substrate 101 are held at the same potential.

According to various embodiments, the angled ion beam 310 may be extracted at a non-zero angle of incidence, shown as θ, with respect to the perpendicular 426. The trajectories of ions within the angled ion beam 310 may be mutually parallel to one another or may lie within a narrow angular range, such as within 10 degrees of one another or less. Thus, the value of θ may represent an average value of incidence angle where the individually trajectories vary up to several degrees from the average value. In various embodiments, the angled ion beam 310 may be extracted as a continuous beam or as a pulsed ion beam as in known systems. For example, the bias supply 320 may be configured to supply a voltage difference between plasma chamber 302 and process chamber 324, as a pulsed DC voltage, where the voltage, pulse frequency, and duty cycle of the pulsed voltage may be independently adjusted from one another.

In various embodiments, reactive gas, such as known gas or gases for reactive ion etching, may be supplied by the source 322 to plasma chamber 302. The plasma 304 may generate various oxidizing species, depending upon the exact composition of species provided to the plasma chamber 302. The source 322 may represent a manifold or a plurality of gas sources in some embodiments. Thus, a first gas source may supply reactive gas for performing reactive angled ion beam etching to etch the liner 110, while a second gas source is used to supply reactive gas for performing reactive angled ion beam etching to etch the semiconductor fins 106.

Figure 3B:
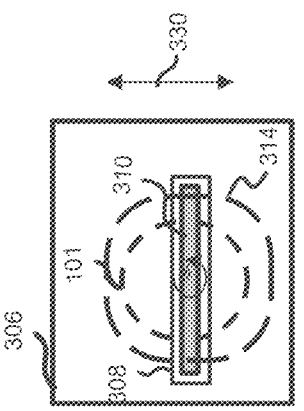
FIG. 3B depicts a face view of an extraction arrangement for the processing apparatus of FIG. 3A.

In various embodiments, the angled ion beam 310 may be provided as a ribbon ion beam having a long axis extending along the X-direction of the Cartesian coordinate system shown in the top plan view of FIG. 3B. By scanning a substrate platen 314 including substrate 101 with respect to the extraction aperture 308, and thus with respect to the angled ion beam 310 along the scan direction 330, the angled ion beam 310 may oxidize portions of the substrate 101.

In this example of FIG. 3B, the angled ion beam 310 is provided as a ribbon ion beam extending to a beam width along the X-direction, where the beam width is adequate to expose an entire width of the substrate 101, even at the widest part along the X-direction. Exemplary beam widths may be in the range of 10 cm, 20 cm, 30 cm, or more while exemplary beam lengths along the Y-direction may be in the range of 2 mm, 3 mm, 5 mm, 10 mm, or 20 mm. A ratio of beam width to beam length may be in the range 5/1, 10/1, 20/1 50/1, or 100/1. The embodiments are not limited in this context.

Notably, the scan direction 330 may represent the scanning of substrate 101 in two opposing (180 degrees) directions along the Y-direction, or just a scan toward the left or a scan toward the right. As shown in FIG. 3B, the long axis of angled ion beam 310 extends along the X-direction, perpendicularly to the scan direction 330. Accordingly, an entirety of the substrate 101 may be exposed to the angled ion beam 310 when scanning of the substrate 101 takes place along a scan direction 330 to an adequate length from a left side to right side of substrate 101, as shown in FIG. 3B.

Referring also to FIG. 1C, in accordance with various embodiments of the disclosure, angled ions may be provided to a first sidewall 106A and a second sidewall 106B by rotating the substrate platen 314 through a twist angle φ of 180 degrees about the perpendicular 326 between two different exposures. Said differently, the different sidewalls may be subject to a first exposure to the angled ions when the substrate is in a first rotational position. The substrate may then be rotated 180 degrees about the perpendicular to a second rotational position, and provided with a second exposure to the angled ions wherein the substrate is in the second rotational position.

Figure 3C:
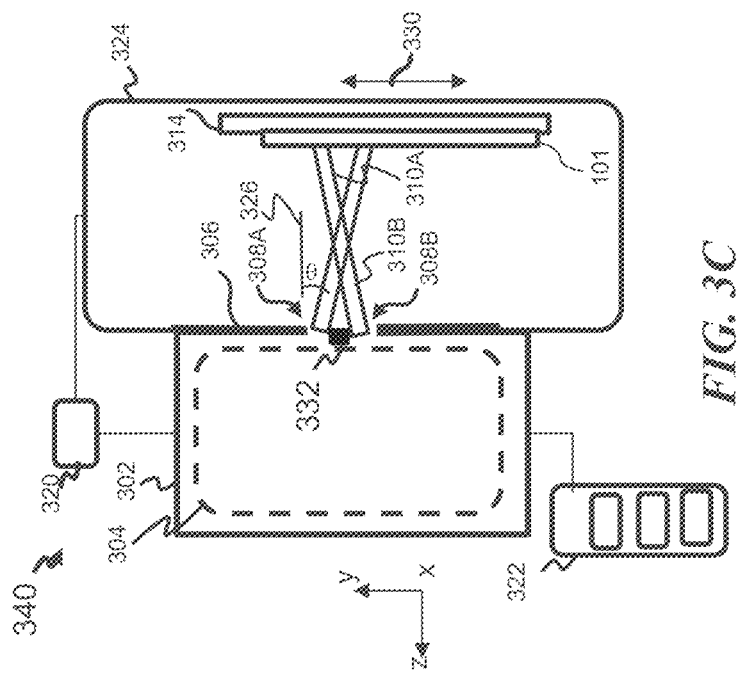
FIG. 3C shows another processing apparatus, depicted in schematic form, in accordance with embodiments of the disclosure.

In other embodiments of the disclosure, a modified apparatus may be used to provide simultaneous exposure of the first sidewall 106A and the second sidewall 106B to angled ions. Turning now to FIG. 3C, there is shown another processing apparatus 340, depicted in schematic form. The processing apparatus 340 represents a processing apparatus for performing angled ion treatment of a substrate, and may be substantially the same as the processing apparatus 300, save for the differences discussed below. Notably, the processing apparatus 340 includes a beam blocker 332, disposed adjacent the extraction aperture 308. The beam blocker 332 is sized and positioned to define a first aperture 308A and a second aperture 308B, where the first aperture 308A forms a first angled ion beam 310A, and the second aperture 308B forms a second angled ion beam 310B. The two angled ion beams may define angles of incidence with respect to the perpendicular 326, equal in magnitude, opposite in direction. As such, the first angled ion beam 310A and the second angled ion beam 310B may treat opposing sidewalls of a semiconductor fin similarly. When configured in the shape of a ribbon beam as in FIG. 3B, these angled ion beams may expose an entirety of the substrate 101 to reactive ion etching of sidewall material by scanning the substrate platen 314 as shown.

FIG. 4 depicts an exemplary process flow 400, according to embodiments of the disclosure. At block 402, a fin array is provided on a substrate, where the fin array may include a plurality of semiconductor fins. The transistor structure may include a set of semiconductor fins and a set of gate structures, disposed on set of semiconductor fins. In some embodiments, the semiconductor fins may be monocrystalline silicon. At block 404, a liner is formed on the plurality of semiconductor fins. According to some embodiments, the liner may be formed of just one layer of silicon oxide. In some examples, the thickness of the silicon oxide may be between 2 nm and 4 nm, and in particular, 3 nm. According to other embodiments, the liner may be formed of an oxide layer, disposed adjacent the semiconductor fins, and a nitride layer, disposed on the oxide layer.

At block 406, the liner is removed from an upper portion of the semiconductor fins using angled ions. According to some embodiments, the angled ions may be provided as an ion beam having a shape of a ribbon beam, and directed to the upper portion. Where the ion beam defines a trajectory forming a non-zero angle of incidence with respect to a perpendicular to a plane of the substrate. In one variant, after the removal of the liner from the upper portion, additional angled ions may be directed to the fin array to etch the upper portion of the semiconductor fins. Accordingly, the width of the semiconductor fins in the upper portion may be reduced from a first width, before exposure to the additional angled ions, to a second width after the exposure to the additional angled ions.

At block 408, a fin liner is deposited on the semiconductor fins. In various embodiments, the fin liner is composed of silicon nitride.

At block 410, a first gapfill operation is performed to provide an insulator between the semiconductor fins. According to some embodiments, the insulator layer may be a silicon oxide material, such as a flowable oxide.

At block 412, a fin cut operation is performed to remove semiconductor fins in the fin array. The fin cut operation may remove, for example, outer semiconductor fins of a fin array, wherein the remaining semiconductor fins after the fin cut operation are covered with the liner in the lower portions.

At block 414, a second gap fill operation is performed. This second gapfill operation may introduce insulator material into regions of a semiconductor substrate containing the fin array where a previous fin cut operation was performed. According to various embodiments the remaining semiconductor fins of the fin array may be covered with insulator material after the second gapfill operation.

At block 416, a fin reveal etching operation is performed to selectively remove the insulator layer in the upper portion of the semiconductor fins. Accordingly, the upper portion of remaining semiconductor fins of the fin array may extend above the top surface of the insulator layer. At block 418, a selective etch is performed to remove the fin liner from the upper portion of the semiconductor fins. Accordingly, the semiconductor fins may present exposed semiconductor to serve as active portions of a transistor device, for example.

The present embodiments provide various advantages over known device structures and fabrication methods. For one advantage, because the liner is removed from upper portions of a fin, a thicker silicon oxide liner may be provided in the sub-fin area while not experiencing pinch off when insulator material is introduced between fins during a gapfill process. For another advantage, by selectively etching upper portions while not etching lower portions, narrower active fins may be fabricated while not sacrificing mechanical stability, since the lower portions retain a larger width. For an additional advantage, because no fin liner, is present after fin reveal etch, additional recess of insulator layer, such as silicon oxide, is avoided. Since known approaches may use a dual liner structure with an oxide layer adjacent a fin, and a silicon nitride layer on top of the oxide layer, after a fin reveal etch removing oxide, a nitride etch, such as hot phosphoric acid, is used after the fin reveal etch. Moreover, to expose the active fins, the known approaches entail a final oxide etch to remove the oxide layer adjacent the semiconductor fins, with the concomitant and unwanted recess of insulator oxide between oxide fins. Additionally, by avoiding the final oxide etch, the present embodiments provide better control of active fin height.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming a semiconductor device, comprising:
   providing a transistor structure, the transistor structure comprising a fin array, the fin array including a plurality of semiconductor fins, disposed on a substrate, wherein a liner is disposed on the plurality of semiconductor fins; and
   directing first angled ions to the fin array, in a reactive ion etching mixture, wherein the liner is removed in an upper portion of the plurality of semiconductor fins, wherein the liner remains in a lower portion of the at least one of the plurality of semiconductor fins, and wherein the upper portion comprises an active fin region to form a transistor device.

2. The method of claim 1, wherein the liner comprises:
   an oxide layer, disposed adjacent the plurality of semiconductor fins; and
   a nitride layer, disposed on the oxide layer.

3. The method of claim 1, further comprising:
   depositing a fin liner on the semiconductor device after the directing the angled ions, wherein the fin liner covers the lower portion and the upper portion of the plurality of semiconductor fins.

4. The method of claim 3, further comprising:
   forming an isolation layer between adjacent fins of the plurality of semiconductor fins; and
   removing the fin liner from the upper portion of the plurality of semiconductor fins.

5. The method of claim 3, further comprising:
   after the directing the first angled ions, directing second angled ions to the upper portion of the semiconductor fins,
   wherein a width of at least one of the plurality of semiconductor fins in the upper portion is reduced from a first width, before the directing the second angled ions, to a second width after the directing the second angled ions.

6. The method of claim 5, wherein the first width is 8 nm to 15 nm.

7. The method of claim 5, wherein the second width is 4 nm to 8 nm.

8. The method of claim 1, comprising directing the first angled ions as an ion beam having a shape of a ribbon beam to the substrate, the ion beam defining a trajectory forming a non-zero angle of incidence with respect to a perpendicular to a plane of the substrate.

9. The method of claim 8, wherein the directing the first angled ions comprises:
   providing a first exposure to the angled ions when the substrate is in a first rotational position;
   rotating the substrate through 180 degrees about the perpendicular to a second rotational position; and
   providing a second exposure to the angled ions wherein the substrate is in the second rotational position.

10. The method of claim 1, wherein the transistor structure further comprises a mask layer, disposed on the plurality of semiconductor fins, wherein the directing the first angled ions comprises directing the first angled ions at a non-zero angle of incidence with respect to a substrate plane, wherein:

$\mathrm{Tan}\ \theta = (H_U + H_M)/(\text{fin pitch} - \text{fin width})$, where $\theta$ is the non-zero angle of incidence, $H_U$ is a height of the upper portion, $H_M$ is a thickness of the mask, fin pitch is a center-to-center distance adjacent fins of the plurality of semiconductor fins, and fin width is a width of a semiconductor fin of the plurality of semiconductor fins.

11. The method of claim 1, wherein the first angled ions selectively etch the liner with respect to the plurality of semiconductor fins.

12. A method of forming a finFET device, comprising:
providing a transistor structure, the transistor structure comprising a fin array formed from a plurality of semiconductor fins, disposed on a substrate, wherein a liner is disposed on the plurality of semiconductor fins, wherein the liner comprises:
an oxide layer, disposed adjacent the semiconductor fins; and
a nitride layer, disposed on the oxide layer;
directing first angled ions to sidewalls of the semiconductor fins, in a reactive ion etching mixture, wherein the liner is removed in an upper portion of the plurality of semiconductor fins; and
after the directing the first angled ions, directing second angled ions to the sidewalls of the semiconductor fins,
wherein a width of the plurality of semiconductor fins in the upper portion is reduced from a first width, before the directing the second angled ions, to a second width after the directing the second angled ions, and
wherein the liner remains in a lower portion of the plurality of semiconductor fins.

13. The method of claim 12, wherein the first width is 8 nm to 15 nm, and wherein the second width is 4 nm to 8 nm.

14. The method of claim 12, wherein the oxide layer comprises a thickness of 2 nm or more.

15. The method of claim 14, wherein the fin array comprises a fin pitch of 45 nm or less.

16. The method of claim 12, wherein the fin array comprises a fin-to-fin spacing of 25 nm or less.

* * * * *